US008075790B2

(12) United States Patent  
Chang et al.

(10) Patent No.: US 8,075,790 B2
(45) Date of Patent: Dec. 13, 2011

(54) FILM REMOVAL METHOD AND APPARATUS

(75) Inventors: Chia-Chiang Chang, Hsinchu Hsien (TW); Chin-Jyi Wu, Hsinchu Hsien (TW); Chen-Der Tsai, Hsinchu Hsien (TW); Chun-Hung Lin, Hsinchu Hsien (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 925 days.

(21) Appl. No.: 12/078,505

(22) Filed: Apr. 1, 2008

(65) Prior Publication Data

US 2008/0185017 A1  Aug. 7, 2008

Related U.S. Application Data

(62) Division of application No. 11/527,443, filed on Sep. 27, 2006, now Pat. No. 7,507,313.

(30) Foreign Application Priority Data

May 15, 2006 (TW) ............................ 95117089 A

(51) Int. Cl.
*B44C 1/22* (2006.01)
*C03C 15/00* (2006.01)
*C03C 25/68* (2006.01)
*C23F 1/00* (2006.01)

(52) U.S. Cl. .............................. 216/67; 216/71; 134/1.1
(58) Field of Classification Search .................... 216/67, 216/71; 134/1.1; 438/706
See application file for complete search history.

(56) References Cited

U.S. PATENT DOCUMENTS

| 5,352,902 A * | 10/1994 | Aoki .............................. 250/575 |
| 6,659,110 B2 | 12/2003 | Fornsel et al. |
| 7,189,654 B2 * | 3/2007 | Yamazaki et al. ............. 438/706 |
| 2004/0089632 A1 * | 5/2004 | Park et al. ........................ 216/71 |

FOREIGN PATENT DOCUMENTS

| CN | 1450413 | 10/2003 |
| JP | 6190269 A | 7/1994 |
| JP | 9-275095 A | 10/1997 |
| JP | 09-321013 A | 12/1997 |
| JP | 11-354290 A | 12/1999 |
| JP | 2000-058508 A | 2/2000 |
| JP | 2003-334436 A | 11/2003 |
| JP | 2004-253785 A | 9/2004 |
| JP | 2004-341542 A | 12/2004 |
| JP | 2005-142368 A | 6/2005 |
| JP | 2005-174879 A | 6/2005 |
| JP | 2005-177566 A | 7/2005 |
| JP | 2005-347278 A | 12/2005 |
| JP | 2006-035193 A | 2/2006 |

* cited by examiner

*Primary Examiner* — Nadine G Norton
*Assistant Examiner* — Mahmoud Dahimene
(74) *Attorney, Agent, or Firm* — Rabin & Berdo, P.C.

(57) ABSTRACT

A film removal method and apparatus for removing a film from a substrate are disclosed. The method comprises the steps of disposing a plasma generator and a sucking apparatus over the substrate, projecting a plasma beam from the plasma generator onto the film obliquely, disposing the sucking apparatus on a reflection path of plasma projected by the plasma generator, and sucking a by-product of an incomplete plasma reaction occurring to the film so as to keep a surface of the substrate clean, with a view to overcoming the drawbacks of deposition of the by-product which results from using the plasma as a surface cleansing means under atmospheric conditions.

6 Claims, 3 Drawing Sheets ly panels.
FILM REMOVAL METHOD AND APPARATUS

CROSS-REFERENCE TO RELATED APPLICATION

This is a division of U.S. application Ser. No. 11/527,443, filed Sep. 27, 2006, which claimed Priority from Taiwanese application No. 095117089, filed May 15, 2006, the entire disclosure of which is incorporated herein by reference.

BACKGROUND OF THE INVENTION

1. Field of the Invention

The present invention relates to a method for film removal and an apparatus thereof, and more particularly, to a method for removing a film using plasma under atmospheric conditions and an apparatus thereof.

2. Description of the Prior Art

Processes of conventional liquid crystal display panels (TFT-LCD) entail switching between a dry process and a wet process repeatedly. In order to accelerate a process, panel manufacturers nowadays perform various processes of TFT-LCD in a dry environment, but it is still necessary to soak panels in photoresist strippers for removing photoresists.

Soaking a panel to remove a photoresist is followed by air-drying the panel, which incurs high manufacturing costs and prolongs the process. In light of the demand for large panels, the aforesaid drawbacks are becoming serious as panel size increases. In order to accelerate a panel process, some panel manufacturers remove photoresists by plasma. Plasma-based removal belongs to a dry process, thus a panel process can be completely carried out at a dry environment. As regards the yield, a process which involves removing a photoresists by soaking the photoresist-coated panel takes one hour to produce 75 pieces of panels. By contrast, the plasma-based photoresist removal process produces 100 to 120 pieces of panels.

Nevertheless, the plasma-based photoresist removal process has to be performed in a vacuum, and it entails continuously introducing gas and a catalyst in order to generate plasma. As a result, the yield increases, but so do the manufacturing costs.

In order to reduce the plasma production costs, Dainippon Screen Mfg. developed a technique whereby plasma is generated under atmospheric conditions to perform surface cleansing. Referring to FIG. 1A, an electric-field bias is generated across electrode plates 1a and 1b and configured to induce a reactant, gas A, to generate plasma. Referring to FIG. 1A again, a substrate 10 passes between the two electrode plates 1a and 1b and undergoes surface cleansing. The substrate 10 can be a fabric to be dyed or a material to be surface-mounted. Alternatively, the substrate 10 can be a liquid crystal panel from which a photoresist is to be removed by plasma.

Nonetheless, subjecting a liquid crystal panel to an electric field usually damages electronic components mounted on the liquid crystal panel. In this regard, Dainippon Screen Mfg. made the following improvements in the aforesaid atmospheric plasma-based surface cleansing technique. Referring to FIG. 1B which differs from FIG. 1B in that, instead of directly passing between the electrode plates 1a and 1b, the substrate 10 is disposed perpendicularly to the electrode plates 1a and 1b which cause plasma to be perpendicularly projected onto the substrate 10, and further, the substrate 10 is moved so as to react with the plasma thoroughly. The aforesaid improvements are open-ended, as it is feasible to modularize a plasma generation device such that the plasma generation device is turned into a plasma jet, for example.

In a situation where the substrate 10 is a photoresist-coated liquid crystal panel, plasma projected perpendicularly onto the liquid crystal panel removes most of the photoresist. However, part of the photoresist fails to react with the plasma but forms a particulate by-product. The by-product splashes and falls by gravity onto the panel, thus the panel yield is affected.

In order to solve the aforesaid drawbacks related to the by-product of the plasma reaction, some proposed installing a panel above a plasma generator for projecting plasma upwardly and vertically to the panel such that the splashed by-product spontaneously falls by gravity. Nevertheless, at a glance, the surfaces of liquid crystal panels are seemingly flat and smooth, they are full of plenty of microstructures indeed. In this regard, projecting plasma perpendicularly to a panel readily removes a photoresist from the fronts of the microstructures, but the perpendicularly projected plasma is unlikely to remove the photoresist from the lateral surfaces of the microstructures thoroughly. In addition, with the demand for large panels increasing, it is extremely inconvenient to invert large panels during a process. To alleviate the inconvenience, special hanging tools are designed to secure the panels in position but prove unsatisfactory because of high costs, not to mention that hanging large panels in the air is likely to bend the large panels. The aforesaid drawbacks also occur to U.S. Pat. No. 6,659,110 which discloses a method which involves disposing a substrate on a roller for solving problems with a by-product of a plasma reaction.

Accordingly, an issue that needs an urgent solution is related to endeavors to overcome the aforesaid drawback.

SUMMARY OF THE INVENTION

In light of the aforesaid drawbacks of the prior art, it is a primary objective of the present invention to provide a film removal method for removing a by-product of a plasma reaction.

Another objective of the present invention is to provide a film removal method for increasing the yield of liquid crystal panels.

Yet another objective of the present invention is to provide a film removal method for minimizing the manufacturing costs of liquid crystal panels.

A further objective of the present invention is to provide a film removal method for removing a photoresist from a liquid crystal panel thoroughly.

In order to achieve the above and other objectives, the present invention discloses a film removal method for removing a film from a substrate. The film removal method comprises the steps of disposing a plasma generator and a sucking apparatus above the substrate, adjusting the plasma generator to allow the plasma generator to obliquely project a plasma beam onto the film, disposing the sucking apparatus on a reflection path of the plasma beam so as to suck a by-product of an incomplete plasma reaction occurring to the film, with a view to keeping a surface of the substrate clean.

In order to achieve the above and other objectives, the present invention also discloses a film removal apparatus for removing the film from the substrate. The film removal apparatus comprises the plasma generator and the sucking apparatus. The plasma generator obliquely projects the plasma onto the film so as to remove the film from the substrate. The sucking apparatus is disposed on the reflection path of the plasma projected by the plasma generator and configured to suck the by-product of the incomplete plasma reaction occurring to the film, with a view to keeping the surface of the substrate clean.

The substrate is a liquid crystal panel while the film is a photoresist. In order to allow the plasma generator to remove the photoresist from a liquid crystal panel thoroughly, both the plasma generator and the sucking apparatus are oppositely rotated about a rotation axis and horizontally moved in relation to the substrate. To be specific, the plasma generator and the sucking apparatus are enclosed by a casing and thereby rotated as a whole.

Unlike the prior art wherein plasma is perpendicularly projected onto the substrate and thus a by-product of the plasma reaction deposits on the substrate, the present invention discloses a film removal method which involves obliquely projecting the plasma onto the film-coated substrate, sucking the by-product which appears on a reflection path of the projected plasma, thus removing the by-product of the plasma reaction to a great extent.

The prior art which involves projecting the plasma perpendicularly onto the substrate has a drawback, that is, it is difficult to remove a photoresist from the lateral surfaces of the microstructures of a liquid crystal panel. By contrast, the film removal method of the present invention involves projecting the plasma obliquely onto the substrate so as to remove the photoresist from the lateral surfaces of the microstructures of a liquid crystal panel.

It is feasible to upwardly project the plasma to remove the photoresist from the liquid crystal panel such that the by-product of the plasma reaction drops spontaneously in accordance with the prior art. Nevertheless, the aforesaid process entails reversing the liquid crystal panel and thereby incurs high costs. By contrast, the film removal apparatus of the present invention allows the liquid crystal panel to keep passing through an assembly line in the same direction and thereby minimizes the manufacturing costs.

In short, the present invention discloses a method for film removal and an apparatus thereof for removing a by-product of a plasma reaction, thus increasing the yield of liquid crystal panels, and reducing the manufacturing costs.

Hence, the present invention has high industrial applicability.

DETAILED DESCRIPTION OF THE EMBODIMENTS

The present invention is herein illustrated with specific embodiments, so that one skilled in the pertinent art can easily understand other advantages and effects of the present invention from the disclosure of the invention.

Figure 1A:
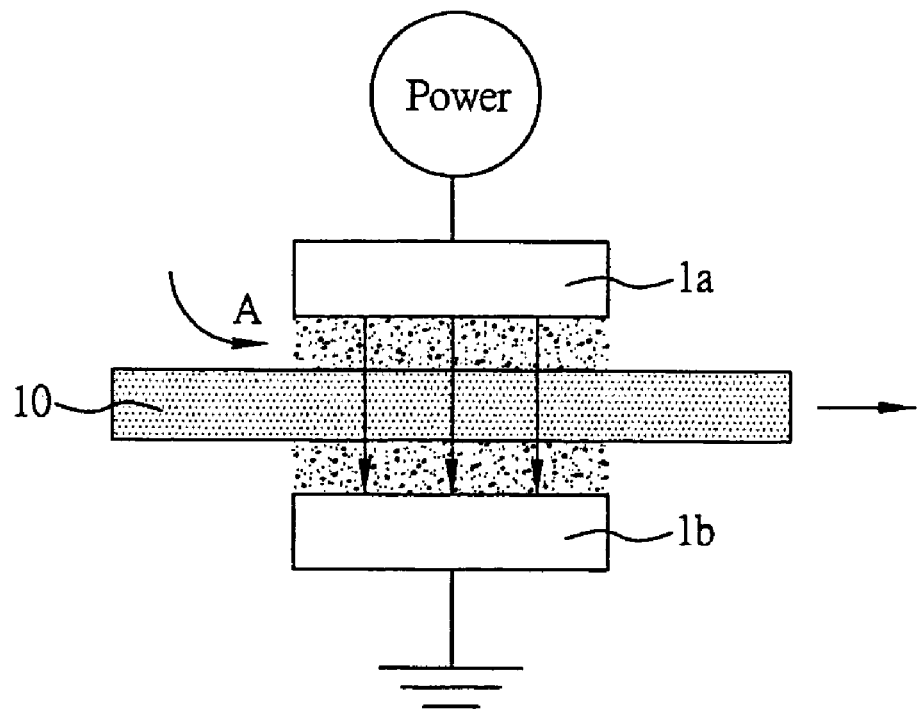
FIGS. 1A and 1B (PRIOR ART) are schematic views of a conventional method which involves using atmospheric plasma as a surface cleansing means.
Figure 1B:
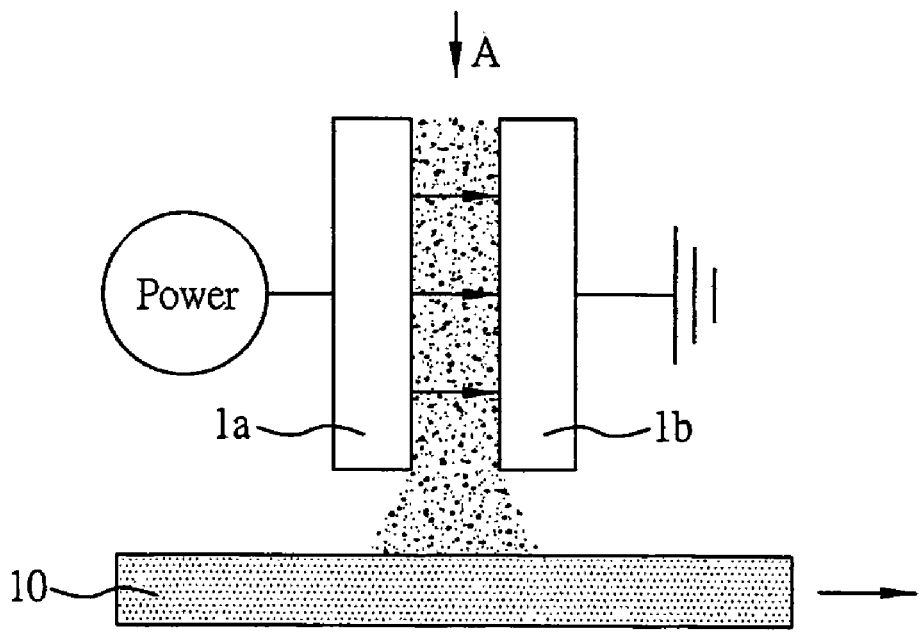
Figure 2A:
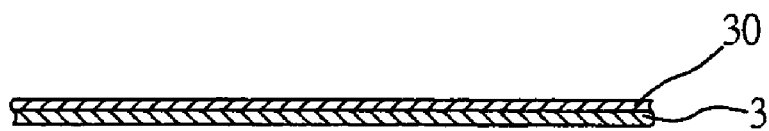
FIGS. 2A to 2C are schematic views illustrating a film removal method of the present invention.
Figure 2B:
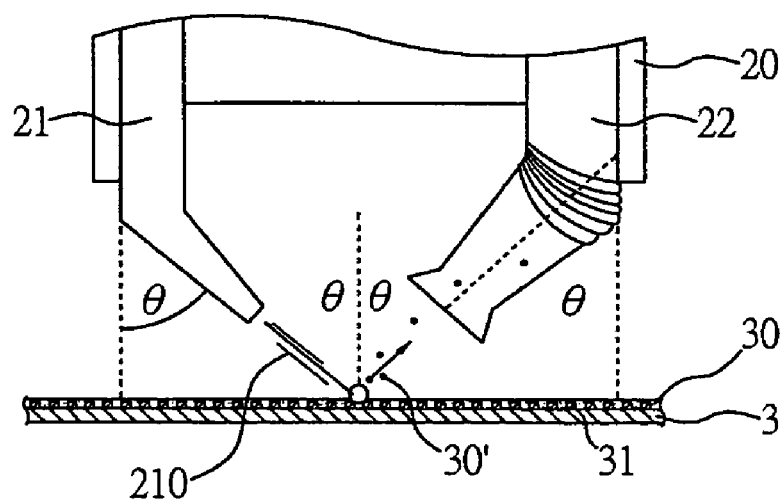
Figure 2C:
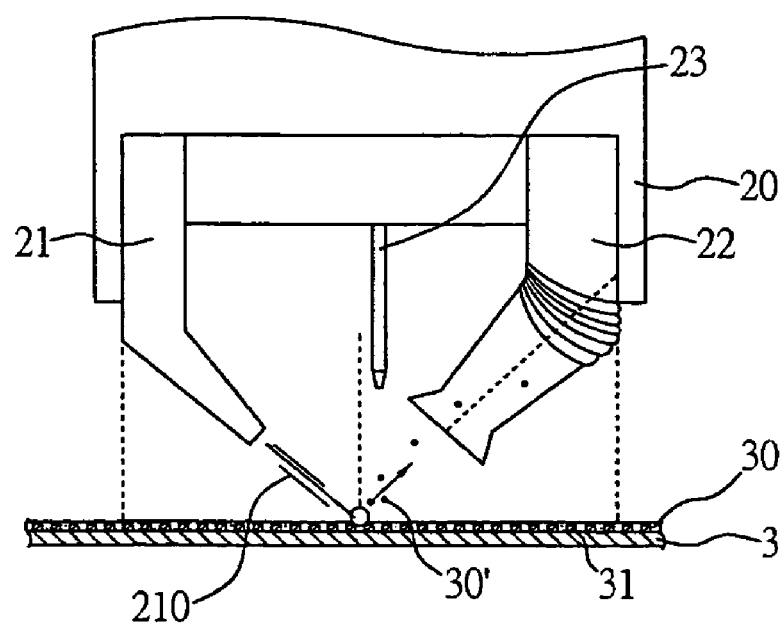

Referring to FIGS. 2A to 2C which are schematic views illustrating a film removal method of the present invention.

As shown in FIG. 2A, the film removal method of the present invention is for removing from a substrate 3 a film 30 disposed thereon. The substrate 3 is a liquid crystal panel while the film 30 is a photoresist disposed on the liquid crystal panel. As shown in FIG. 2B, a plasma generator 21 and a sucking apparatus 22 are disposed above the substrate 3 first. Gases applicable to the plasma generator 21 are, namely clean dry air and gaseous $N_2$. Then, plasma is formed under ordinary atmospheric conditions.

Afterward, adjusting the plasma generator 21 such that the plasma generator 21 obliquely projects a plasma beam 210 onto the film 30, disposing the sucking apparatus 22 on a reflection path of the plasma beam 210 so as to suck a by-product 30' of an incomplete reaction of the film 30 and the plasma beam 210 with a view to keeping a surface of the substrate 3 clean.

In order to allow the plasma generator 21 to remove a photoresist from a liquid crystal panel thoroughly, both the plasma generator 21 and the sucking apparatus 22 are oppositely rotated about a rotation axis and horizontally moved in relation to the substrate 3. To be specific, both the plasma generator 21 and the sucking apparatus 22 are enclosed by a casing 20 and thereby driven by a motor to rotate as a whole.

The substrate 3 is a liquid crystal panel and thereby comprises a plurality of microstructures 31. The front surfaces and the lateral surfaces of the microstructures 31 are coated with the photoresist (the film 30). The film removal method of the present invention involves obliquely projecting the plasma beam 210 onto the substrate 3 and thereby thoroughly removing the photoresist from the front surfaces and the lateral surfaces of the microstructures 31.

As shown in FIG. 2C, the film removal method of the present invention further involves disposing a reaction sensor 23 between the plasma generator 21 and the sucking apparatus 22 so as to detect whether the film 30 has already been thoroughly removed. As regards the detection mechanism, the reaction sensor 23 detects whether formation of the by-product 30' continues active, or detects for presence of traces of the substrate 3. Detection of inactive formation of the by-product 30' in an area indicates that the photoresist in the area has already undergone a plasma reaction thoroughly, and that the by-product 30' of the plasma reaction has already been thoroughly removed. Upon feedback of a sensing signal, both the plasma generator 21 and the sucking apparatus 22 may be moved to another area to remove the photoresist.

Figure 3:
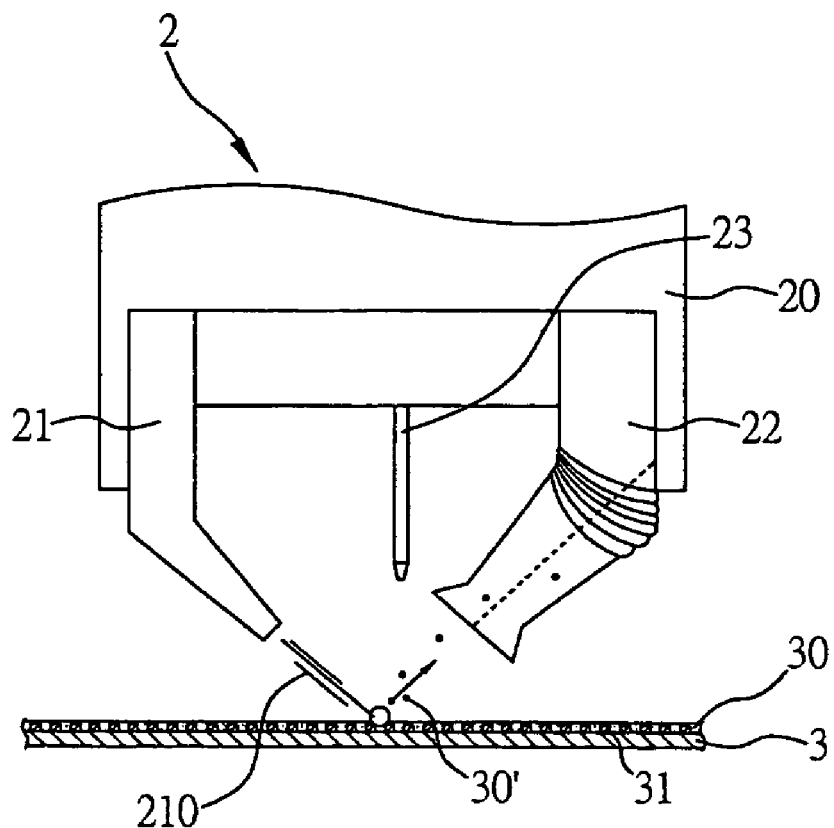
FIG. 3 is a schematic view illustrating an embodiment of a film removal apparatus of the present invention.

Referring to FIG. 3, the present invention also discloses a film removal apparatus 2 for removing the film 30 from the substrate 3. The film removal apparatus 2 comprises the plasma generator 21 and the sucking apparatus 22. The plasma generator 21 obliquely projects the plasma beam 210 onto the film 30 so as to remove the film 30 from the substrate 3. The sucking apparatus 22 is disposed on the reflection path of the plasma beam 210 projected by the plasma generator 21 so as to suck the by-product 30' of the incomplete plasma reaction occurring to the film 30 with a view to keeping the surface of the substrate 3 clean. The film removal apparatus 2 further comprises the reaction sensor 23 disposed between the plasma generator 21 and the sucking apparatus 22 and configured to detect whether the film 30 has already been thoroughly removed.

Figure 4:
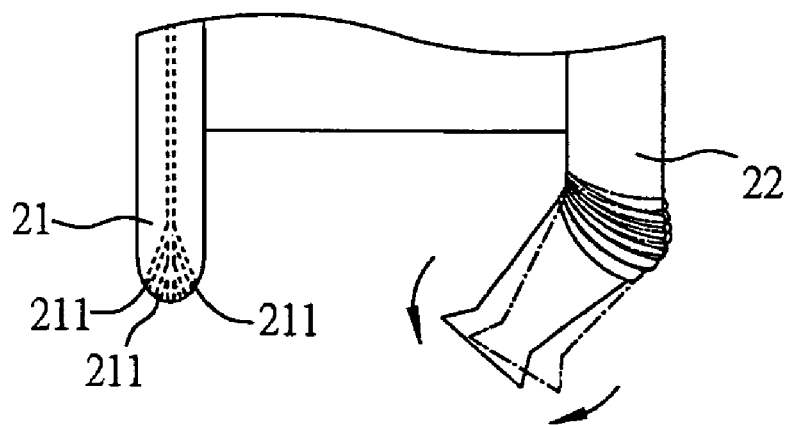
FIG. 4 is a schematic view illustrating another embodiment of a film removal apparatus of the present invention.

Referring to FIG. 4, the end of the plasma generator 21 is disposed with a plurality of jet channels 211 pointing in different directions for projecting the plasma beam 210 in all directions. The sucking apparatus 22 adjusts a slope thereof in response to the plasma beam 210 projected by the jet channels in different directions. The sucking apparatus 22 comprises a wide-mouthed end so as to suck the by-product 30' to the fullest.

Unlike the prior art wherein plasma is perpendicularly projected onto a substrate and thus a by-product of the plasma reaction deposits on the substrate, the present invention discloses a film removal method which involves obliquely projecting the plasma onto the film-coated substrate, sucking the by-product which appears on a reflection path of the projected plasma, thus removing the by-product of the plasma reaction to a great extent.

The prior art which involves projecting the plasma perpendicularly onto the substrate has a drawback, that is, it is difficult to remove a photoresist from the lateral surfaces of the microstructures of a liquid crystal panel. By contrast, the film removal method of the present invention involves projecting the plasma obliquely onto the substrate so as to remove the photoresist from the lateral surfaces of the microstructures of a liquid crystal panel.

It is feasible to upwardly project the plasma to remove the photoresist from the liquid crystal panel such that the by-product of the plasma reaction drops spontaneously in accordance with the prior art. Nevertheless, the aforesaid process entails reversing the liquid crystal panel and thereby incurs high costs. By contrast, the film removal apparatus of the present invention allows the liquid crystal panel to keep passing through an assembly line in the same direction and thereby minimizes the manufacturing costs.

In short, the present invention discloses a method for film removal and an apparatus thereof for removing a by-product of a plasma reaction, thus increasing the yield of liquid crystal panels, and reducing the manufacturing costs. Hence, the present invention has high industrial applicability.

The aforesaid embodiments merely serve as the preferred embodiments of the present invention. They should not be construed as to limit the scope of the present invention in any way. Hence, any other changes can actually be made in the present invention. It will be apparent to those skilled in the art that all equivalent modifications or changes made, without departing from the spirit and the technical concepts disclosed by the present invention, should fall within the scope of the appended claims.

What is claimed is:

1. A film removal method for removing a film from a substrate, comprising the steps of:
    disposing a plasma generator and a sucking apparatus above the substrate such that the principal axes of the plasma generator and the sucking apparatus are oriented at respective oblique angles with respect to the substrate;
    adjusting the plasma generator so as to project a plasma beam from the plasma generator onto the film at an oblique projection angle with respect to the substrate, so that the projected plasma beam has a reflection path at an oblique reflection angle with respect to the substrate;
    adjusting the sucking apparatus to orient the principal axis thereof along the reflection path so as to suck and remove a by-product of an incomplete plasma reaction occurring to the film to keep a surface of the substrate clean;
    rotating the plasma generator and the sucking apparatus about a rotation axis such that the plasma generator and the sucking apparatus are disposed on the opposite sides of the rotation axis, and
    moving the plasma generator and the sucking apparatus horizontally in relation to the substrate.

2. The film removal method of claim 1, wherein the substrate is a liquid crystal panel while the film is a photoresist.

3. The film removal method of claim 1, wherein besides the plasma generator and the sucking apparatus, a reaction sensor is disposed therebetween for determining if the film has been thoroughly removed.

4. The film removal method of claim 3, wherein the reaction sensor detects for the by-product, detection of absence of the by-product indicates that the plasma reaction is done.

5. The film removal method of claim 3, wherein the reaction sensor detects for traces of the substrate, detection of presence of the traces of the substrate indicates that the plasma reaction is done.

6. The film removal method of claim 1, wherein the size of the oblique projection angle is the same as the size of the oblique reflection angle.

* * * * *